United States Patent [19]

Josephson et al.

[11] Patent Number: 5,237,218

[45] Date of Patent: Aug. 17, 1993

[54] STRUCTURE AND METHOD FOR MULTIPLEXING PINS FOR IN-SYSTEM PROGRAMMING

[75] Inventors: Gregg R. Josephson, Aloha, Oreg.; Ju Shen, San Jose, Calif.; Roy D. Darling, Forest Grove, Oreg.; Chan-Chi J. Cheng, San Jose, Calif.

[73] Assignee: Lattice Semiconductor Corporation, Hillsboro, Oreg.

[21] Appl. No.: 695,356

[22] Filed: May 3, 1991

[51] Int. Cl.$^5$ .......................................... H03K 19/177
[52] U.S. Cl. ................................. 307/465; 307/469; 307/343
[58] Field of Search ................ 307/465, 468, 480, 243, 307/443, 469; 364/716; 340/825.8, 825.83, 825.52, 825.44, 825.47; 365/189.12; 377/79, 81

[56] References Cited

U.S. PATENT DOCUMENTS

| | | | |
|---|---|---|---|
| 4,870,302 | 9/1989 | Freeman | 307/465 |
| 4,876,466 | 10/1989 | Kondou et al. | 307/465 |
| 4,918,641 | 4/1990 | Jigour et al. | 307/465 X |
| 5,015,886 | 5/1991 | Choi et al. | 307/443 X |
| 5,023,484 | 6/1991 | Pathak et al. | 307/465 |
| 5,023,606 | 6/1991 | Kaplinsky | 307/465 X |
| 5,027,011 | 6/1991 | Steele | 307/465 |

*Primary Examiner*—David R. Hudspeth
*Attorney, Agent, or Firm*—Skjerven, Morrill, MacPherson, Franklin & Friel

[57] ABSTRACT

A structure and method for in-system programming of a programmable logic device are provided. The in-system programming structure provides one dedicated pin for in-system programming function, additional in-system programming pins are multiplexed with programmable input/output pins used in functional operations. When an enable signal is received at the dedicated pin, the multiplexed pins relinquish their roles as programmable input/output pin to become in-system programming pins. A state machine controls the programming steps. The in-system programming structure can be cascaded in a "daisy chain" fashion.

35 Claims, 11 Drawing Sheets

STRUCTURE AND METHOD FOR MULTIPLEXING PINS FOR IN-SYSTEM PROGRAMMING

FIELD OF THE INVENTION

This invention relates to the design of integrated circuits, and in particular, relates to the design of programmable logic devices.

BACKGROUND OF THE INVENTION

Unlike a conventional programmable logic device (PLD), an in-system programmable logic device (ISPLD) can be reprogrammed in place, i.e. without removal from the system in which it is deployed. ISPLDs are therefore especially suited for implementing dynamically reconfigurable circuits. The method of reprogramming a programmable logic device in place is known as in-system programming (ISP). Some ISPLDs, such as those available from Lattice Semiconductor Corporation, Hillsboro, Oreg, can be reprogrammed using an operating voltage power supply, rather than a high programming voltage, as in the case of many PLDs. U.S. Pat. No. 4,855,954, entitled "In-system Programmable Logic Device with Four Dedicated Terminals," by J. E. Turner et al., assigned to Lattice Semiconductor Corporation, which is also the assignee of the present Application, discusses ISPLD technology. U.S. Pat. No. 4,855,954 is hereby incorporated by reference in its entirety.

Figure 1:
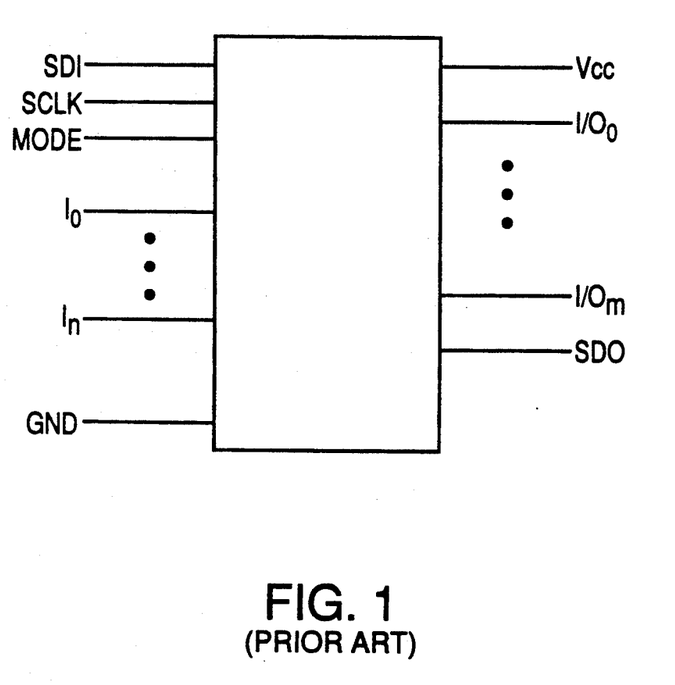
FIG. 1 shows an idealized pin-out diagram of an in-system programmable logic device (ISPLD) having pins mode, SCLK, SDI and SDO pins dedicated for reprogramming purpose in the prior art.

FIG. 1 shows an idealized pin-out of an ISPLD. As shown in FIG. 1, the ISPLD comprises a number of input-only pins ($I_1, I_2, \ldots, I_n$), a number of programmable input/output pins ($I/O_1, I/O_2, \ldots, I/O_m$), power (VCC) and ground (GND) pins, and a set of ISP pins (SDI, SDO, SCLK, and mode). During operation, if the ISPLD is to be reprogrammed, the signal associated with the SCLK pin is activated to place the ISPLD into the ISP mode. Once in the ISP mode, a state machine having numerous states takes over the control of the programming activities. The new program is input serially into the program memory of an ISPLD over the serial input pin SDI. The rate of serial input is 1-bit per clock period. A clock signal is provided on pin SCLK when the ISP mode is entered. Each ISPLD can also provide on its output pin SDO data received from its serial input pin SDI. Thus, a number of ISPLDs can be "daisy-chained" together by tying the serial input pin SDI of an ISPLD to the serial output pin SDO of another ISPLD. Any ISPLD in the daisy chain can be re-programmed by shifting in the new program at the serial input pin SDI of the first ISPLD in the daisy chain, and through every ISPLD in the daisy chain ahead in the daisy chain of the ISPLD to be programmed.

Because the pins of an integrated circuit package are considered a scarce resource, minimizing the number of pins dedicated for reprogramming purpose maximizes the number of pins available to the operation for which the ISPLD is deployed. Thus, it is highly desirable to have an ISPLD having very few pins dedicated to reprogramming purpose.

SUMMARY OF THE INVENTION

In accordance with the present invention, a structure and a method to implement an in-system programmable logic device are provided using only one dedicated in-system programming pin. Additional in-system programming pins are made available by multiplexing pins which are input/output pins, when not in in-system programming mode. When an enable signal is received, these pins relinquish their roles as functional pins to become in-system programming (ISP) pins. In-system programming is performed under the control of an instruction-based state machine. An instruction set is provided to control the ISP activities.

The structure in accordance with the present invention can be connected in a "daisy chain" fashion. In addition, an instruction is provided to connect, under in-system programming mode, a serial input pin with a serial output pin, thereby to provide a bypass path for rapidly shifting data and/or command to any device in the daisy chain.

The present invention provides reprogramming of ISPLDs at the cost of only one dedicated pin.

The present invention is better understood upon consideration of the following detailed description and the accompanying drawings.

BRIEF DESCRIPTION OF THE DRAWINGS

FIG. 2b'–2b'' is a schematic diagram showing the circuit 250, which implements the ISP input pins mode, SDI, and SCLK of the embodiment shown in FIG. 2a.

FIG. 2c'–2c'' is a schematic diagram showing the circuit 200, which implements the ISP output pin SDO of the embodiment shown in FIG. 2a.

FIG. 3 shows the functional programmable logic in the embodiment of the present invention shown in FIG. 2a.

DETAILED DESCRIPTION

Figure 2A:
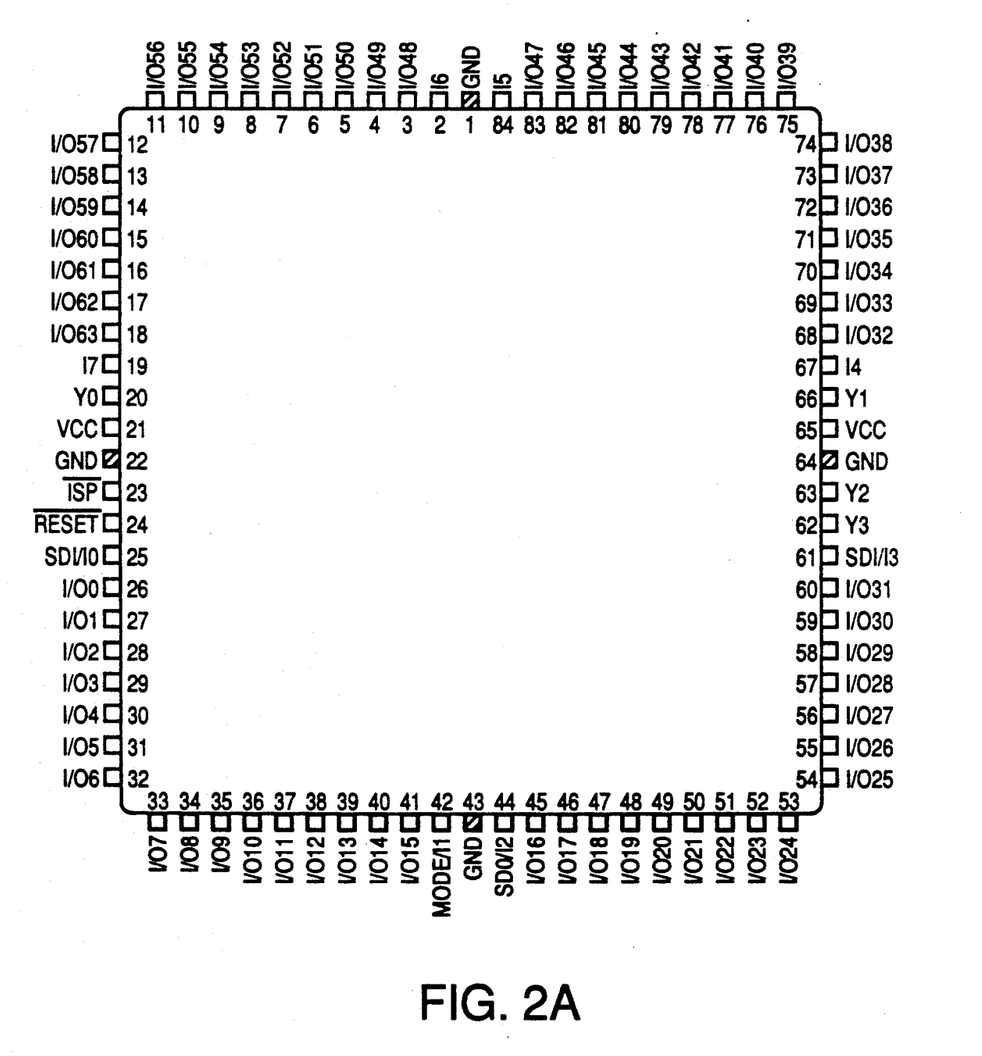
FIG. 2a is a pin-out of an embodiment of the present invention showing multiplexing of four input pins ($I_0$–$I_3$) for in-system programming functions when the signal on the $\overline{ISP}$ pin is enabled, in accordance with the present invention.

FIG. 2a shows a pin-out of an embodiment of the present invention in an 84-pin package, having 64 programmable input/output (I/O) pins $I/O_0$–$I/O_{63}$, eight input pins $I_0$ to $I_7$, four clock pins $Y_0$–$Y_3$, two power (VCC) pins, four ground (GND) pins, one reset ($\overline{RESET}$) pin and one ISP enable ($\overline{ISP}$) pin. In accordance with the present invention, as described below, input pins $I_0$–$I_3$ also serve as in-system programming (ISP) pins when the signal on the $\overline{ISP}$ pin is asserted. It will be appreciated that, although the present invention is illustrated by a programmable logic device having a specific organization to be described herein, the present invention is applicable to any device providing an ability to be programmed "in-system". The present embodiment includes electrically erasable programmable memory cells, which are programmable using the same 5-volt power supply as the logic circuits on the chip, and does not lose the program upon "power-down."

Figure 3A:
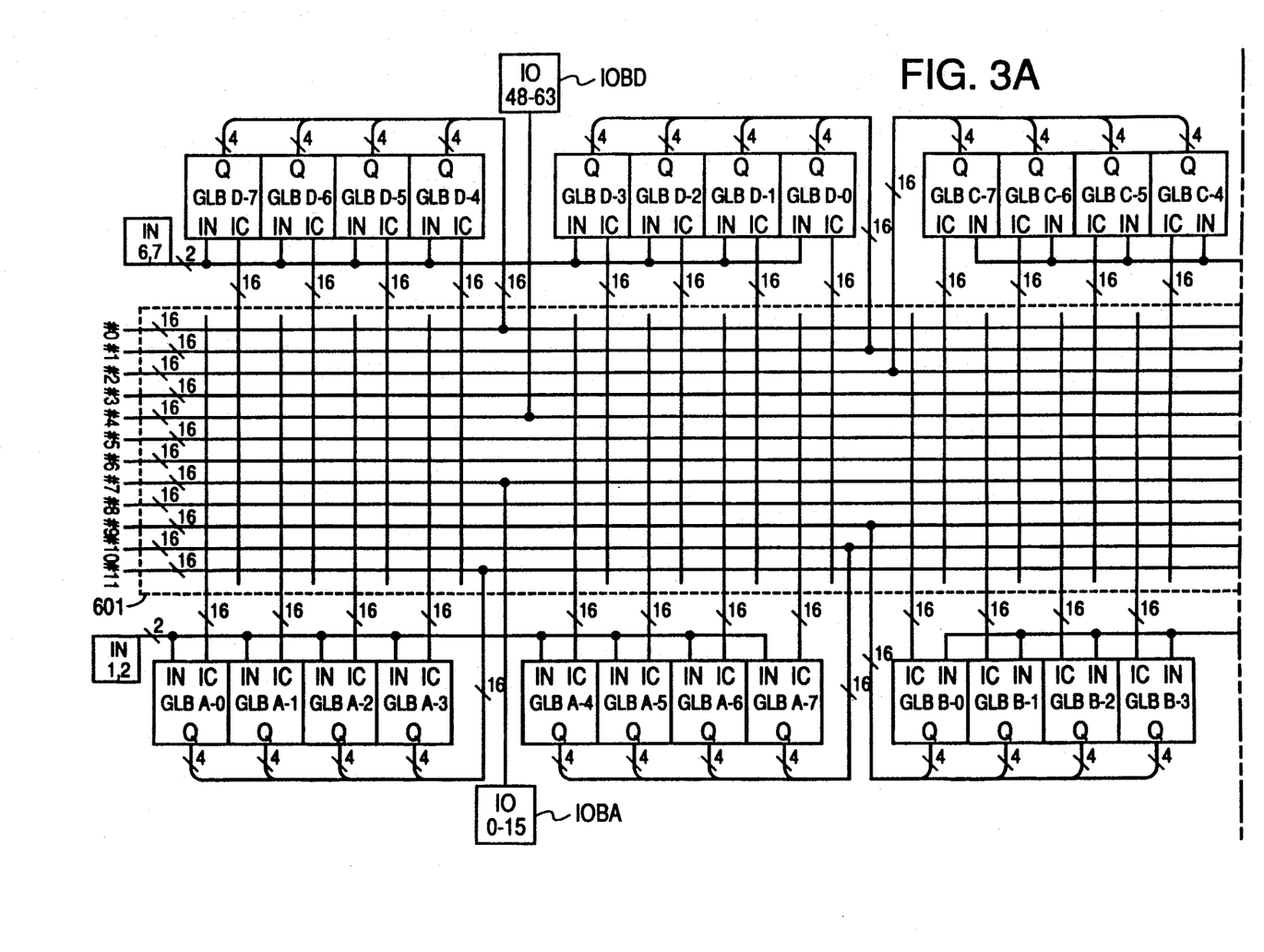
Figure 3B:
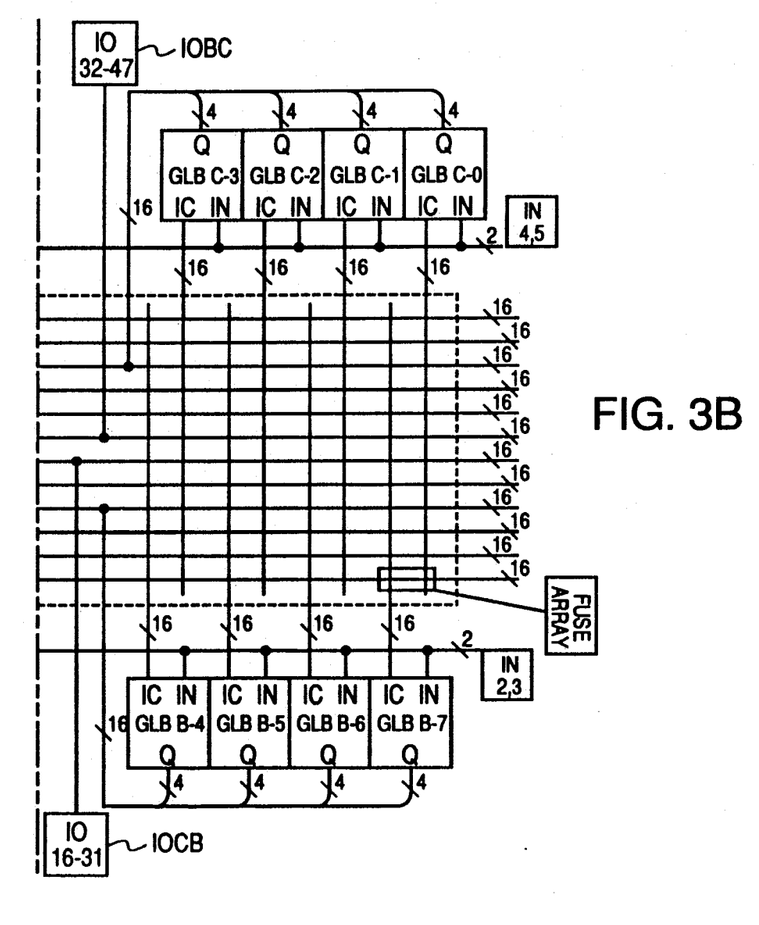

The programmable logic of the present embodiment is shown in FIG. 3. As shown in FIG. 3, the programmable logic structure comprises a programmable interconnect array 601, four I/O blocks (IOBA-IOBD), each controlling 16 of the 64 I/O pins I/$O_0$-I/$O_{63}$, four groups of eight "generic logic blocks" (GLBs), respectively designated $GLBA_0$-$GLBA_7$, $GLBB_0$-$GLBB_7$, $GLBC_0$-$GLBC_7$ and $GLBD_0$-$GLBD_7$. The 32 GLBs, which are programmably interconnected by the programmable interconnect array 601, implement the programmed logic functions. The programmable interconnect array 601 is also called the routing resource pool (RRP) 601.

In FIG. 3, each GLB receives two input signals directly from two of the eight input pins $I_0$-$I_7$, three clock signals selected from the output signals of another GLB and the clock pins $Y_0$-$Y_3$, and sixteen input signals from the RRP 601, and provides four output signals. Each group of eight GLBs is associated with two of the eight input pins $I_0$-$I_7$. For example, the eight $GLBA_0$-$GLBA_7$ each receive the signals on the input pins $I_0$ and $I_1$. The four output signals of each GLB are provided to the RRP 601 for routing to any one of the 32 GLBs. Each GLB is associated with two I/O pins in one of four I/O blocks. Within each GLB are 42 rows by 20 columns of memory cells. Of the 42 rows of memory cells, six rows are "architectural" cells for configurating structures such as non inverted signals or inverted signals. The remaining 36 rows are "array" cells for programming the logic array. In sixteen of the GLBs, each GLB is provided an extra row of twenty memory cells, called the "electronic signature row" (ESR) which allows the user to store a "signature" bit-pattern for identification purpose. ESR can be used, for example, to identify the program stored in the associated GLB. A security cell, which when enabled, prevents the stored program to be read from the external pins. The RRP 601 can be programmed to route up to sixteen signals as input to each GLB from the pool of 64 I/O pins I/$O_0$-I/$O_{63}$, and the 128 output signals from all the GLBs. Each of the 64 I/O pins I/$O_0$-I/$O_{63}$ can be independently programmed to be an input, an output or a bidirection pin.

When the signal on the $\overline{ISP}$ pin is asserted (in this embodiment, the signal on the $\overline{ISP}$ pin is brought to a logic low state), I/O pins I/$O_0$-I/$O_{63}$ each go into a high-impedance state, and the present embodiment goes into ISP mode. In ISP mode, the input pins $I_0$, $I_1$, $I_2$ and $I_3$ become, respectively, SDI (serial data in), mode, SDO (serial data out), and SCLK (Shift clock) by appropriately setting internal multiplexers which enable the signals received on these pins to be provided to the ISP logic. Of course, other pin assignments for the ISP pins are possible. In fact, other than the $\overline{ISP}$ pin, which is required to be a dedicated pin, there is no restriction on how the ISP pins can be assigned.

Figure 2B:
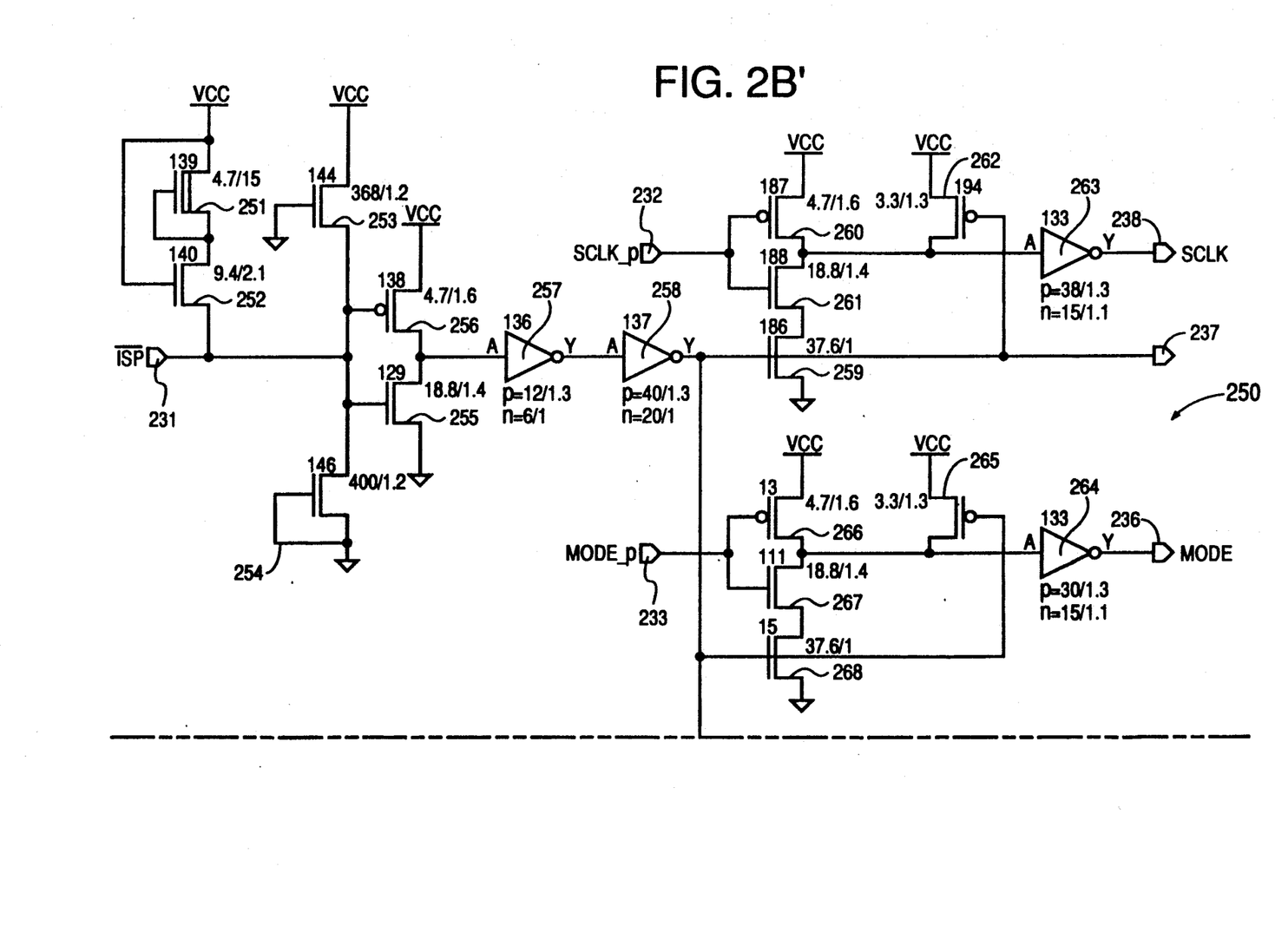

FIG. 2b is a schematic diagram of a circuit 250 which implements the ISP input pins. As shown in FIG. 2b, the $\overline{ISP}$, the mode, the SCLK, and the SDI pins are represented by the terminals 231-234 respectively. If the $\overline{ISP}$ pin 231 is left floating, the depletion mode transistor 251 and the NMOS transistor 252 pull the $\overline{ISP}$ pin 231 to a logic high state. Transistors 253 and 254 protect ISP logic circuits receiving the signal on the $\overline{ISP}$ pin against electrostatic discharge damage caused by improper handling of the integrated circuit package.

The signal on the signal $\overline{ISP}$ pin is inverted by an inverter (i.e. the combination of transistors 255 and 256), and then amplified by inverters 257 and 258 before being provided respectively to transistor pairs 259-262, 268-265 and 271-272 to enable the SCLK pin 232, the mode pin 233 and the SDI pin 234. Transistors 259, 268, 271 are each part of a NAND gate, which provides the inverted signal of the corresponding pin to the ISP logic. For example, when the NAND gate formed by transistors 259, 260, 261 and 262 is enabled by the signal received on the gate terminal of transistor 259 (i.e. the signal on the $\overline{ISP}$ pin inverted), the signal on the SCLK pin is inverted and provided on the NAND gate's output terminal 274. When ISP is disabled, the pull-up transistors (e.g. transistors 262 and 265 on the SCLK pin 232) cause a logic low state at each of the terminals 235, 236 and 238. This condition can also be accomplished by setting the $\overline{ISP}$ pin to logic high. Terminals 235, 236 and 238 are respectively the terminals at which the ISP logic receives the signal on the SDI, the mode and the SCLK pins. In this manner, as will be discussed below, the state machine of the current embodiment is locked in a known state.

Figure 2C:
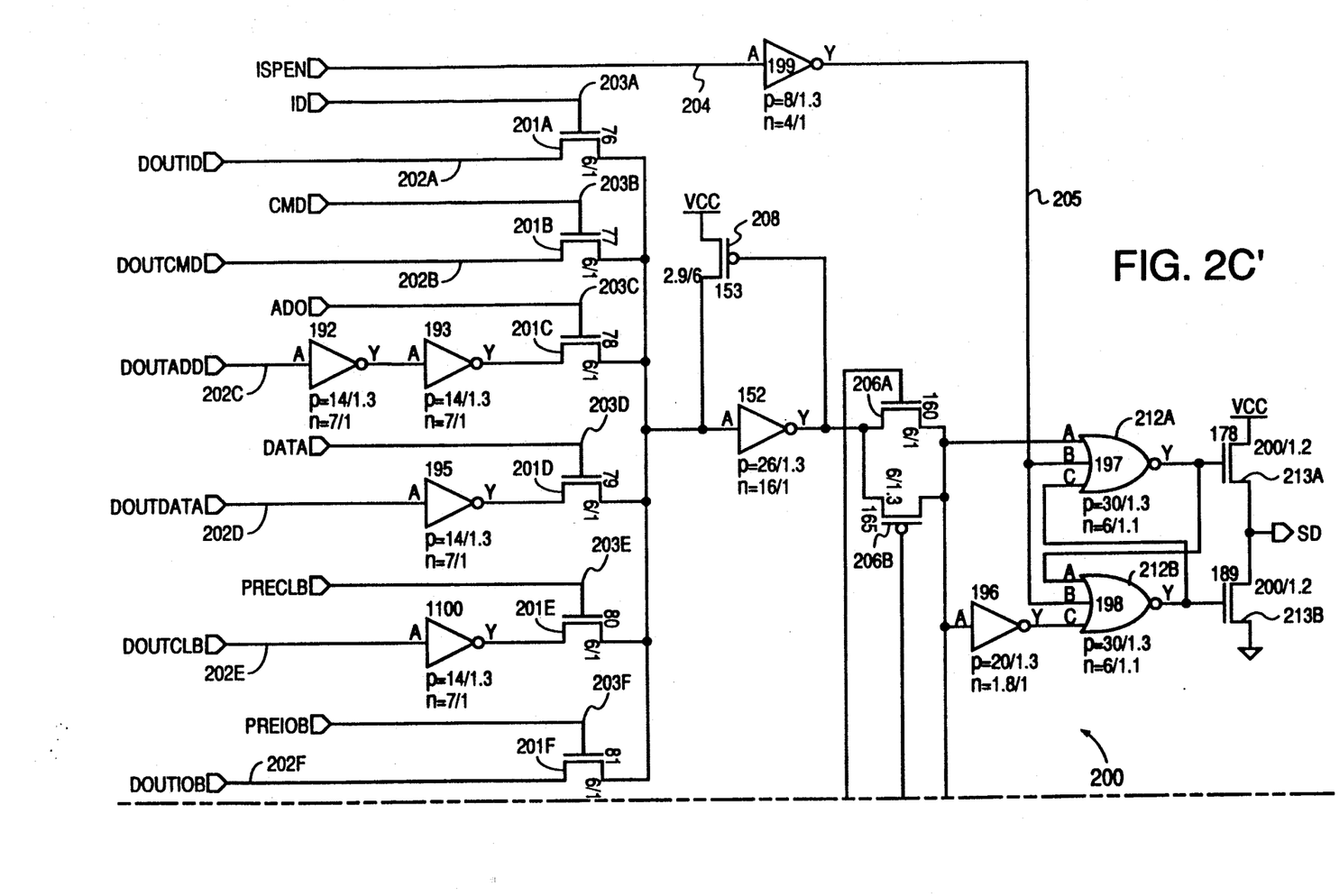
Figure 5:
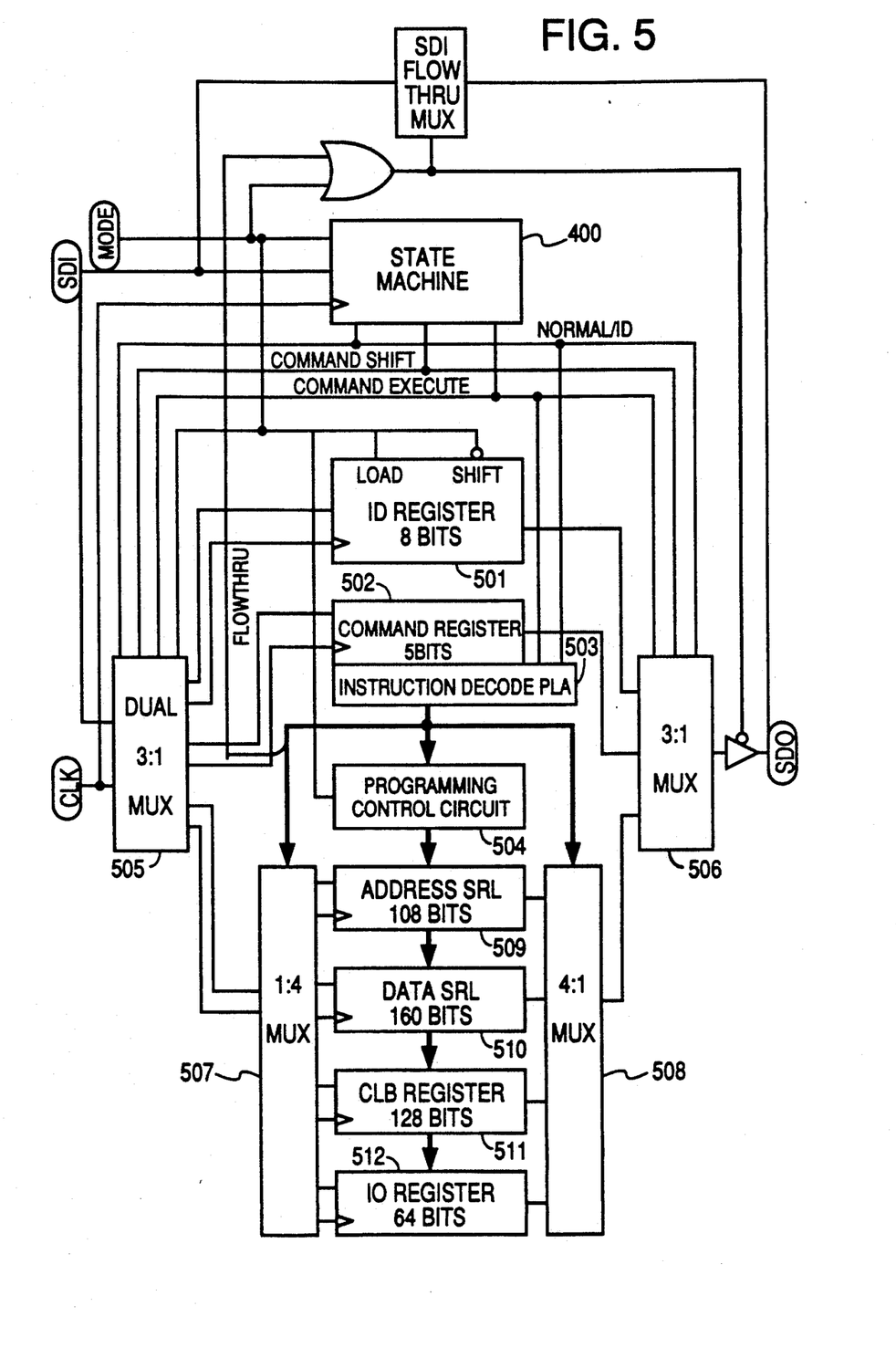
FIG. 5 is a block diagram of the internal interface to the ISP pins, and the functional units involved in the ISP operation.

FIG. 2c is a schematic diagram of a circuit 200, which implements the output ISP pin SDO. As shown in FIG. 2c, circuit 200 receives input data on any one of the leads 202a-202f, or the data on lead 210, which is provided by the ISP input pin SDI. Each of the leads 202a-202f receives the serial output data stream from one of the ISP registers, which are shown in FIG. 5 and discussed below. Respectively, leads 202a-202f receive data from the ID register 501, command register 502, address register 509, data register 510, GLB register 511, and IO register 512. At any given time, circuit 200 receives at most one of the serial output data stream from these registers on leads 202a-202f. That is, only one of the transistors 201a-201f will pass the data stream on the corresponding leads 202a-202f for output on ISP pin SDO. Transistors 201a-201f each receive an enable signal at its gate terminal, which is indicated respectively by leads 203a-203f. At any given time, at most one of the enable signals 203a-203f is activated by the decoding logic 503 (FIG. 5) to render the corresponding transistor in transistors 201a-201f conducting. Transistor 208 pulls to power supply voltage the data transferred over one of the transistors 201a-201f.

Both the FLOWTHRU command (to be described below) and the logic high state signal on the ISP input pin mode provide that the data on the ISP input pin SDI to be transferred to the ISP output pin SDO. Transfer gates 206 and 207, formed by transistor pairs 206a-206b and 207a-207b, multiplex the data going to the ISP output pin SDO between one of the register output data and the data on the ISP input pin SDI. An output flip-flop 212, formed by the cross-coupled NOR gates 212a and 212b, receives and stores the selected output data from one of the transfer gates 206 and 207. Output flip-flop 212 is enabled by the signal on lead 205, which is logically the signal received on the ISP enable pin $\overline{ISP}$. When enabled, the content of flip-flop 212 is buffered by inverter 213 (formed by transistors 213a and 213b) and provided on ISP pin SDO.

Figure 4:
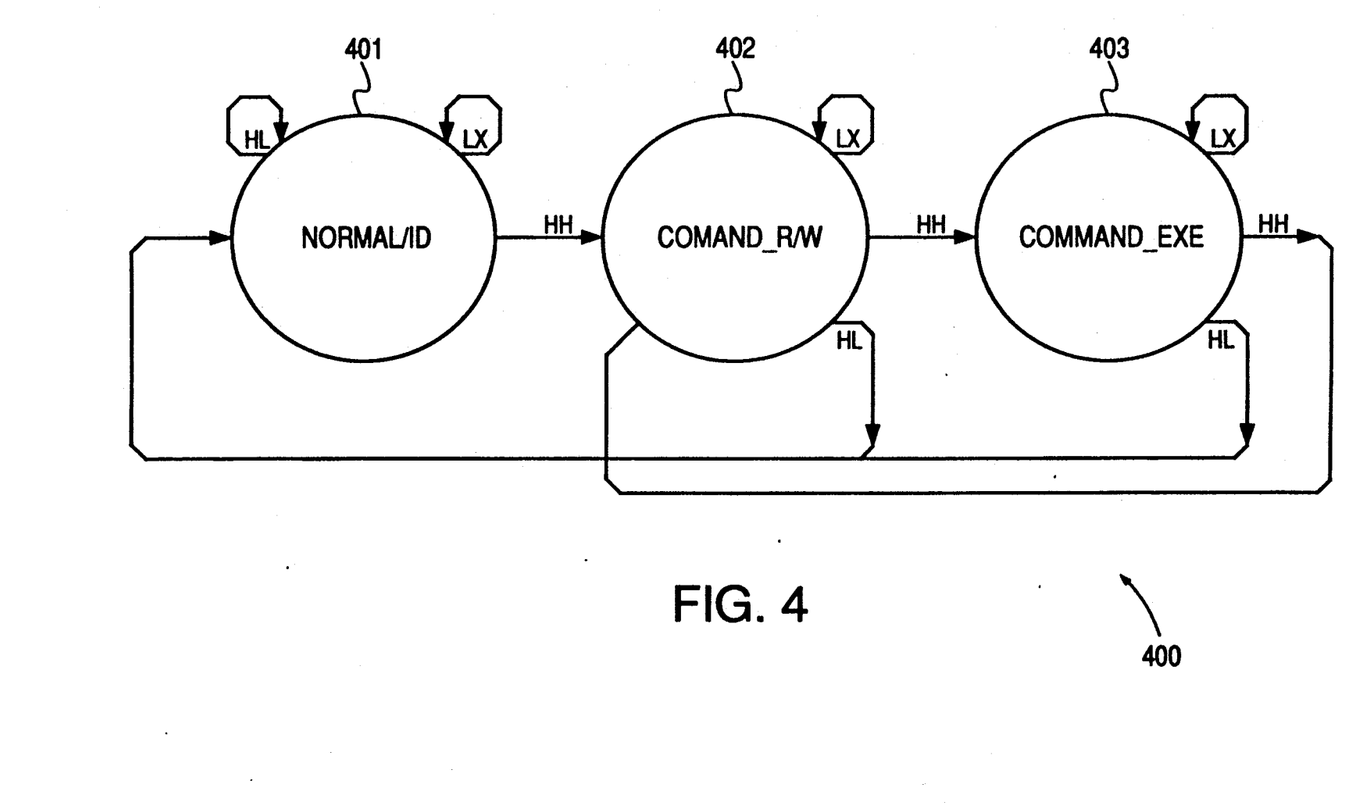
FIG. 4 shows the three states of the state machine 400 controlling the in-system programming operation, in accordance with the present invention.

The operation of the ISP mode is next described with reference to FIG. 4 and 5. The ISP mode is controlled by an instruction-based state machine 400 shown in FIG. 4. FIG. 5 is a block diagram of the internal interface to the ISP pins and the functional units involved in the ISP operation. As shown in FIG. 4, the state machine 400 comprises three states 401, 402 and 403, corresponding respectively to the ID/NORMAL, command and execute states. Timing of the state machine 400 is provided by the clock signal on the SCLK pin. In this embodiment, every state change is effective at the next clock period after the signals on the SDI and mode pins are provided. When the ISP mode is entered, the state machine is in the ID/NORMAL state 401. During functional mode of the embodiment's operation, the state machine 400 stays locked in the ID/NORMAL state 401, which is unlocked when a logic low signal is received at the ISP enable pin $\overline{ISP}$.

The id state 401 can be entered during ISP mode at any time from any state after one shift clock SCLK transition by bringing the signal on the mode pin to logic high and the signal on the SDI pin logic low. A state transition from the ID/NORMAL state 401 to the command state 402, from the command state 402 to the execute state 403, or from the execute state 403 back to the command state 402 can be accomplished by bringing both the mode and the SDI pins to logic high. When the mode pin is at logic low, the SDI pin is a data input pin, and the current state is held.

After entering the ID/NORMAL state 401, if the mode pin is then provided a logic high signal and the SDI pin is at the same time provided a logic low signal the state machine is instructed to load into the ID register 501 an 8-bit "ID", which identifies the embodiment's device type. The ID information associates the device with such parametric values as the number of GLBs on the chip, the number of I/O pins available etc. In the successive clock periods, after the mode pin goes to logic low, the ID information in ID register 501 is shifted out of the SDO pin through multiplexer 506 serially while the value of the signal at the SDI pin is shifted into the ID register 501 through multiplexer 505. Therefore, if the present embodiment is daisy-chained with a number of similar devices, i.e. the output signal on the SDO pin is provided to the SDI pin of the next device etc., the ID of each device can be examined after the appropriate clock periods. In this manner, the device information of each device in the daisy chain can be examined before programming begins.

As mentioned above, the command state 402 is entered from the ID/NORMAL state 401 by bringing to logic high both the mode and the SDI pins. In the command state 402, a 5-bit command is shifted serially into the command register 502. This command is decoded by the instruction decode PLA 503, and provided for execution in the program control circuitry 504 during the execution state 403. As in the ID state 401, the signal on the SDI pin is shifted serially into the current register and the content of the current register (i.e. the command register 502, when in command state 402) is simultaneously shifted out on the SDO pin. This arrangement allows a number of ISP devices to be chained in a daisy chain. Execution of the command in the command register 502 is effectuated by bringing the state machine to the execution state 403, which is entered from the command state 402 by bringing both mode and SDI pins to logic high. Using 5-bit commands, a possible thirty two (5 bits) commands can be defined. For example, the commands provided in Table 1 below can be implemented.

TABLE 1

| | In Circuit Programming instructions | |
|---|---|---|
| | | CMD |
| 0. NOP | No operation | 00000 |
| 1. ADDSHFT | Address register shift | 00001 |
| 2. DATASHFT | Data register shift | 00010 |
| 3. GBE | Global bulk erase Erase pia, array, architecture and security cells | 00011 |
| 4. PIABE | PIA bulk erase Erase pia cells | 00100 |
| 5. ARRBE | Array bulk erase Erase array cells | 00101 |
| 6. ARCHBE | Architecture bulk erase Erase architecture cells | 00110 |
| 7. PROGEVEN | Program even columns Program even columns of array, pia and architecture cells at the rows selected by Address SR | 00111 |
| 8. PROGODD | Program odd columns Program odd columns of array, pia and architecture cells at the rows selected by Address SR | 01000 |
| 9. SFPRG | Program security cell | 01001 |
| 10. VERIFYEVEN | Verify even columns programmed cells Verify even columns of array, pia and architecture programmed cells. Only one row can be selected for each verification | 01010 |
| 11. VERIFYODD | Verify odd columns programmed cells Verify odd columns of array, pia and architecture programmed cells. Only one row can be selected for each verification | 01011 |
| 12. GLCPRELD | Preload GLB registers | 01100 |
| 13. IOPRELD | Preload I/O Cell registers | 01101 |
| 14. FLOWTHRU | Flow through SDI flow through to SDO | 01110 |
| 15. PROGESR | Program ESR Address SR is automatically cleared to 0 | 01111 |
| 16. ERAALL | Erase all Erase pia, array, architecture, ES and security cells | 10000 |
| 17. VERESR | Verify ESR Address SR is automatically cleared to 0 | 10001 |
| 18. VEREVENH | Verify even columns erased cells Verify even columns pia, array and architecture erased cells. Only one row can be selected for each verification | 10010 |
| 19. VERODDH | Verify odd columns erased cells Verify odd columns pia, array and architecture erased cells. Only one row can be selected for each verification | 10011 |
| 20. NOP | No operation | 10100 |
| . | . | . |
| 31. INIT | Initialize | 11111 |

In the execution state 403, the command stored in command register 502 and decoded by the instruction decode PLA 503 is executed. If the instruction is to load data into the data register 510 (i.e. the command DATASHFT), for example, the appropriate number of bits are shifted into the data register 510 from the SDI pin after the mode pin goes to logic low, while the same number of bits in data register 510 are shifted out to the SDO pin. The data path from SDI to SDO is set up by the four multiplexers 505–508. As shown in FIG. 5, data are received for the 108-bit address register 509, 160-bit data register 510, 128-bit GLB register 511 (4 bits for each GLB), and 64-bit I/O register 512 (1 bit for each I/O pin). A command "FLOWTHRU" allows the signal on the SDI pin to be provided immediately to the SDO pin. The FLOWTHRU command is executed in execute state 403 to allow quick serial data transfer over the daisy chain, bypassing the registers 509-512 (i.e. the FLOWTHRU command shifts data through a 0-bit register). The FLOWTHRU effect can also be accomplished in the ISP mode by holding the mode pin at logic high. The state machine 400 can be returned to the command state 402 from the execution state 403 by bringing both the mode and SDI pins to logic high. Alternatively, the state machine 400 can be returned to the ID state 401 from any state by bring the mode pin to logic high, and the SDI pin to logic low.

Since the instruction-based state machine has only three states 401, 402 and 403, and programming in the ISP mode is accomplished using commands of an instruction set, programming is much more structured and simplified over the prior art, which employs a state machine having numerous states.

Figure 6:
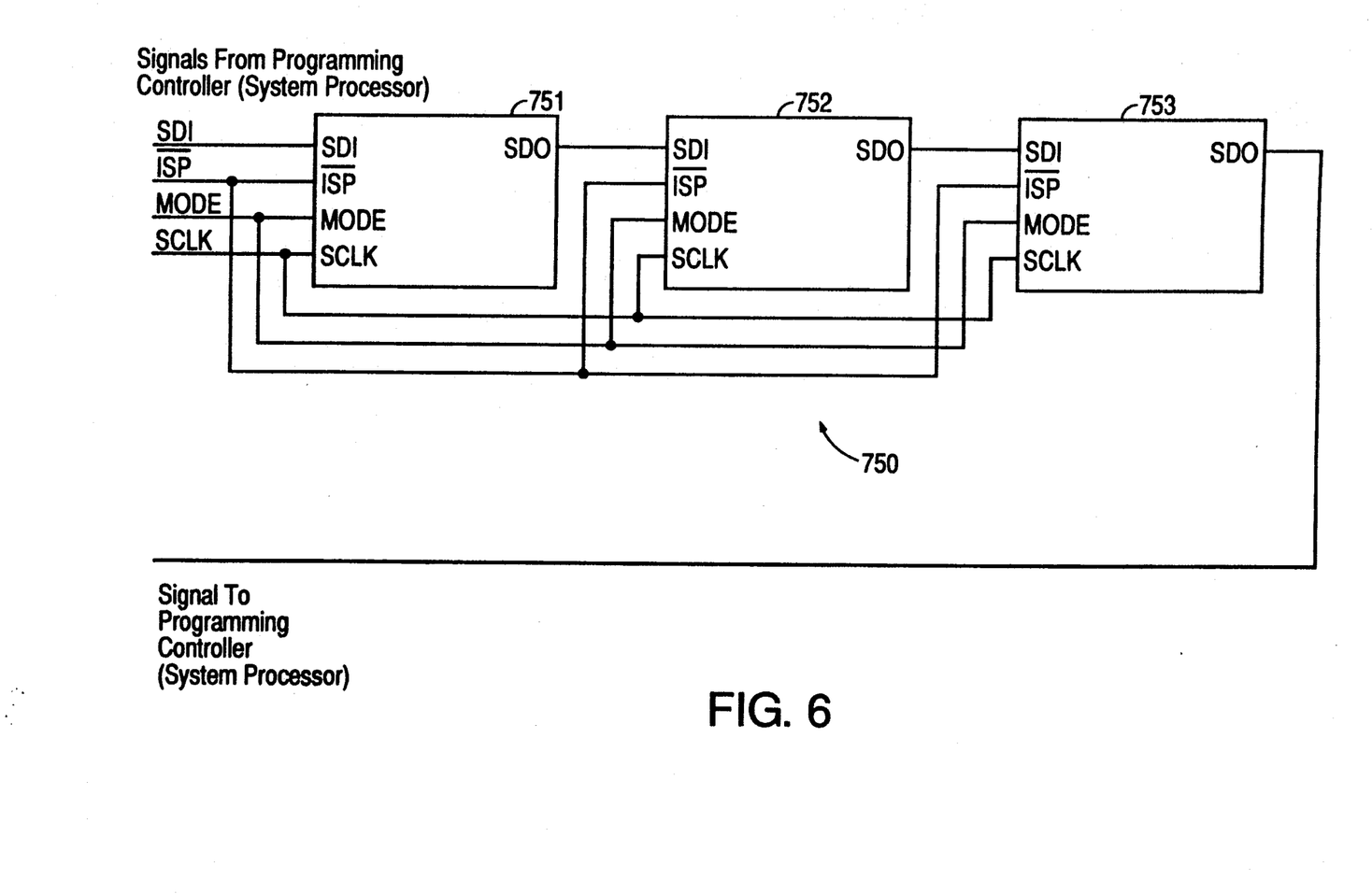
FIG. 6 shows a configuration of three devices for ISP operations, these devices each have the ability to multiplex input pins for ISP operations in accordance with the present invention.

FIG. 6 shows a system 750 including three chips 751, 752 and 753 each having ISP capability daisy chained in accordance with the present invention. As shown in FIG. 6, the pins of chips 751-753 are connected in common. Likewise, the SCLK and mode pins of each chip 751-753 are connected in common. The SDI and SDO pins of each chip are, however, connected in a daisy chain fashion. Yet, this configuration does not restrict the same in-system programming to be applied to all three chips 751-753 simultaneously. In order to program chip 752, for example, the $\overline{ISP}$ is placed in logic low, thereby placing all three chips 751-753 in ISP mode. However, the FLOWTHRU command is shifted into both the command registers of chips 751 and 753 to allow in-system programming to be applied only to chip 752.

The above detailed description is provided to illustrate the specific embodiments of the present invention described herein. It is appreciated the skilled person will be able to provide numerous modifications and variations within the scope of the present invention upon consideration of the detailed description and the accompanying drawings. The present invention is defined by the following claims.

We claim:

1. An in-system programmable logic device for implementing a logic function, comprising:
    pin for receiving an enable signal having first and second states, said first state enabling in-system programming of said device;
    pin for receiving a mode input signal when said enable signal is in said first state, said mode input signal receiving pin being used as a pin for said logic function when said enable signal is in said second state;
    pin for receiving a serial input signal when said enable signal is in said first state, said serial input signal receiving pin being used as a pin for said logic function when said enable signal is in said second state;
    pin for providing a serial output signal when said enable signal is in said first state, said serial output signal receiving pin being used as a pin for said logic function when said enable signal is in said second state; and
    pin for receiving a clock signal when said enable signal is in said first state, said clock signal receiving pin being used as a pin for said logic function when said enable signal is in said second state.

2. A structure as in claim 1, further comprising a state machine for controlling programming of said in-system programmable device.

3. A structure as in claim 1, further comprising a command register, said command register receiving serially input commands from said serial input pin, and providing the content of said command register serially to said serial output pin.

4. A structure as in claim 3, further comprising means for decoding the command stored in said command register.

5. A structure as in claim 1, further comprising a plurality of programmable logic circuits for implementing said logic function.

6. A structure as in claim 2, further comprising a programmable interconnect array providing interconnection amongst said plurality of programmable logic circuits.

7. A method for providing an in-system programmable logic device, for implementing a logic function, comprising the steps of:
    providing a pin for receiving an enable signal having first and second states, said first state enabling in-system programming of said device;
    providing a pin for receiving a mode input signal when said enable signal is in said first state, said mode input signal receiving pin being used as a pin for said logic function when said enable signal is in said second state;
    providing a pin for receiving a serial input signal when said enable signal is in said first state, said serial input signal receiving pin being used as a pin for said logic function when said enable signal is in said second state;
    providing a pin for outputting a serial output signal when said enable signal is in said first state, said serial output signal receiving pin being used as a pin for said logic function when said enable signal is in said second state; and
    providing a pin for receiving a clock signal when said enable signal is in said first state, said clock signal receiving pin being used as a pin for said logic function when said enable signal is in said second state.

8. A method as in claim 7, further comprising the step of providing a state machine for controlling programming of said in-system programmable device.

9. A method as in claim 7, further comprising the step of providing a command register, said command register receiving serially input commands from said serial input pin, and providing the content of said command register serially to said serial output pin.

10. A method as in claim 9, further comprising the step of providing means for decoding the command stored in said command register.

11. A method as in claim 7, further comprising the step of providing a plurality of programmable logic circuits for implementing said logic function.

12. A method as in claim 11, further comprising the step of providing a programmable interconnect array providing interconnection amongst said plurality of programmable logic circuits.

13. An apparatus for in-system programming, comprising:
    means for receiving input data;
    means for receiving a mode signal;
    means, receiving said mode signal and said input data, for holding a state variable representing one of first, second and third states, said state variable transitioning from one of said first, second and third states to another one of said first, second and third state in accordance with transitions of said input data and said mode signal;

a command register for receiving said input data as a command upon a transition of said state variable from said first state to said second state;

means for decoding said command in said command register to provide control signals; and means, receiving said control signals, for executing a predetermined program encoded in said control signals upon said a transition of said state variable from said second state to said third state.

14. An apparatus as in claim 13, further comprising means for receiving a clock signal, and wherein said means for receiving input data receives said input data serially and synchronized with said clock signal.

15. An apparatus as in claim 13, further comprising:
means responsive to a first set of selection signals for steering said input data to a plurality of data paths; and a plurality of data registers each associated with one of said plurality of data paths, each data register receiving said input data steered to said associated data path.

16. An apparatus as in claim 15, further comprising:
means, connected to said plurality of data registers and said command register, for providing in accordance with a second set of selection signals the content of one of said command register and said data registers; and means, coupled to receive said content, for providing output data.

17. An apparatus as in claim 15, further comprising bypass means for providing said input data to said means for providing output data.

18. An apparatus as in claim 17, wherein said bypass means being responsive to said means for executing a predetermined program.

19. An apparatus as in claim 16, wherein said first and second sets of selection signals being provided by said means for executing a predetermined program.

20. An apparatus as in claim 15 wherein a designated one of said plurality of data registers loads a predetermined identification upon said state variable transitioning into said first state from one of said second and third states.

21. A combination comprising first and second apparatuses, each apparatus being substantially similar to the apparatus recited in claim 16, wherein the means for receiving input data of said second apparatus is coupled to receive the output data of said first apparatus.

22. An integrated circuit comprising:
a mode pin for specifying alternatively a programming mode and a functional mode of said integrated circuit;
a plurality of pins each performing a programming function under programming mode and an input/output function under functional mode; and
a program control unit for controlling programming of said integrated circuit under said programming mode;
wherein when said integrated circuit is in said programming mode, the pins of said integrated circuit, other than said plurality of pins, are set to high impedance state.

23. An integrated circuit as in claim 22, wherein said program control unit comprises:
a state machine having a plurality of states under said programming mode; and
a control logic circuit for controlling the operation of said integrated circuit in accordance with said states during said programming mode.

24. An integrated circuit as in claim 23, wherein said plurality of states comprises:
an "ID/NORMAL" state in which normal functional operations are carried out;
a command state in which a plurality of commands are received and decoded; and
an execute state in which said decoded commands are executed.

25. An integrated circuit as in claim 23, wherein said control logic circuit comprises:
a command unit for receiving and decoding during said programming mode one of a plurality of instructions;
a plurality of data registers; and
a programming control circuitry for executing said instruction decoded by said command unit.

26. An integrated circuit as in claim 25, wherein said control logic circuit further comprises means, in accordance with said instruction, for steering said serial input data signal to one of said plurality of data registers and for steering the content of one of said plurality of data registers serially as said serial output data signal.

27. An integrated circuit as in claim 25, wherein said command unit comprises:
a command register for receiving and holding one of said plurality of instructions; and
means for decoding said instruction in said command register.

28. An integrated circuit as in claim 25, said integrated circuit further comprising a plurality of reprogrammable logic circuits, each logic circuit associated with an address and reprogrammed by receiving programming data specified for said address, and wherein said plurality of data registers comprises an address register for specifying said address and a data register for providing said programming data.

29. An integrated circuit as in claim 25, further comprising an ID register for storing an predetermined bit string identifying said integrated circuit.

30. An integrated circuit as in claim 28, wherein said plurality of instructions comprises instructions for applying said programming data to said reprogrammable logic circuits and for shifting said program data serially as said serial output data signal.

31. An integrated circuit as in claim 28, wherein said reprogrammable logic circuits comprises a plurality of registers, and wherein said plurality of instructions comprises instructions for loading said registers of said reprogrammable logic circuit, and for scanning the contents of said registers of said reprogrammable logic circuits serially as said serial output data signal.

32. An integrated circuit comprising:
a mode pin for specifying alternatively a programming mode and a functional mode of said integrated circuit;
a plurality of pins each performing a programming function under programming mode and an input/output function under functional mode; and
a program control unit for controlling programming of said integrated circuit under said programming mode;

wherein said when said integrated circuit is in said programming mode, the pins of said integrated circuit, other than said plurality of pins, are set to hold the logic states of said functional mode prior to entering said programming mode.

33. An integrated circuit comprising:

a mode pin for specifying alternatively a programming mode and a functional mode of said integrated circuit;

a plurality of pins each performing a programming function under programming mode and an input-/output function under functional mode; and a program control unit for controlling programming of said integrated circuit under said programming mode;

wherein said plurality of pins comprises:

a pin for receiving a serial input data signal;

a pin for outputting a serial output data signal; and a pin for receiving a shift clock signal.

34. An integrated circuit as in claim 33, wherein said mode pin receives during said programming mode a signal specifying whether or not said serial input data signal is provided as said serial output data signal, bypassing said program control unit.

35. An integrated circuit as in claim 33, wherein said serial input data signal, said serial output data signal and said shift clock signal are each gated with the signal on said mode pin.

* * * * *